(12) United States Patent
Kim

(10) Patent No.: US 7,821,638 B2
(45) Date of Patent: Oct. 26, 2010

(54) ALIGNMENT MARK

(75) Inventor: Yo-Jong Kim, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 324 days.

(21) Appl. No.: 11/935,107

(22) Filed: Nov. 5, 2007

(65) Prior Publication Data

US 2008/0106738 A1     May 8, 2008

(30) Foreign Application Priority Data

Nov. 3, 2006    (KR) ...................... 10-2006-0108511

(51) Int. Cl.
*G01B 11/00* (2006.01)
(52) U.S. Cl. ...................................... 356/401; 356/399
(58) Field of Classification Search ......... 356/399–401, 356/620
See application file for complete search history.

(56) References Cited

U.S. PATENT DOCUMENTS

| | | | | |
|---|---|---|---|---|
| 4,632,557 A | * | 12/1986 | Thompson | 356/401 |
| 5,294,975 A | * | 3/1994 | Norman et al. | 356/401 |
| 5,528,372 A | * | 6/1996 | Kawashima | 356/401 |
| 5,998,295 A | * | 12/1999 | Madurawe | 438/666 |
| 6,002,182 A | * | 12/1999 | Madurawe | 257/797 |
| 6,624,524 B1 | * | 9/2003 | Madurawe | 257/797 |

FOREIGN PATENT DOCUMENTS

| | | |
|---|---|---|
| JP | 03-101142 | 4/1991 |
| JP | 2000-089241 | 3/2000 |
| JP | 2000-182914 | 6/2000 |
| JP | 2004-319549 | 11/2004 |

\* cited by examiner

*Primary Examiner*—Tarifur R. Chowdhury
*Assistant Examiner*—Isiaka O Akanbi
(74) *Attorney, Agent, or Firm*—Myers Bigel Sibley & Sajovec, PA

(57) ABSTRACT

An alignment mark on a substrate includes a first pattern and a second pattern. The first pattern has a substantially planar upper surface by which parallel light is specularly reflected. The second pattern forms an interface with the first pattern and has a plurality of fine patterns. Parallel light is irregularly reflected by the second pattern.

14 Claims, 10 Drawing Sheets

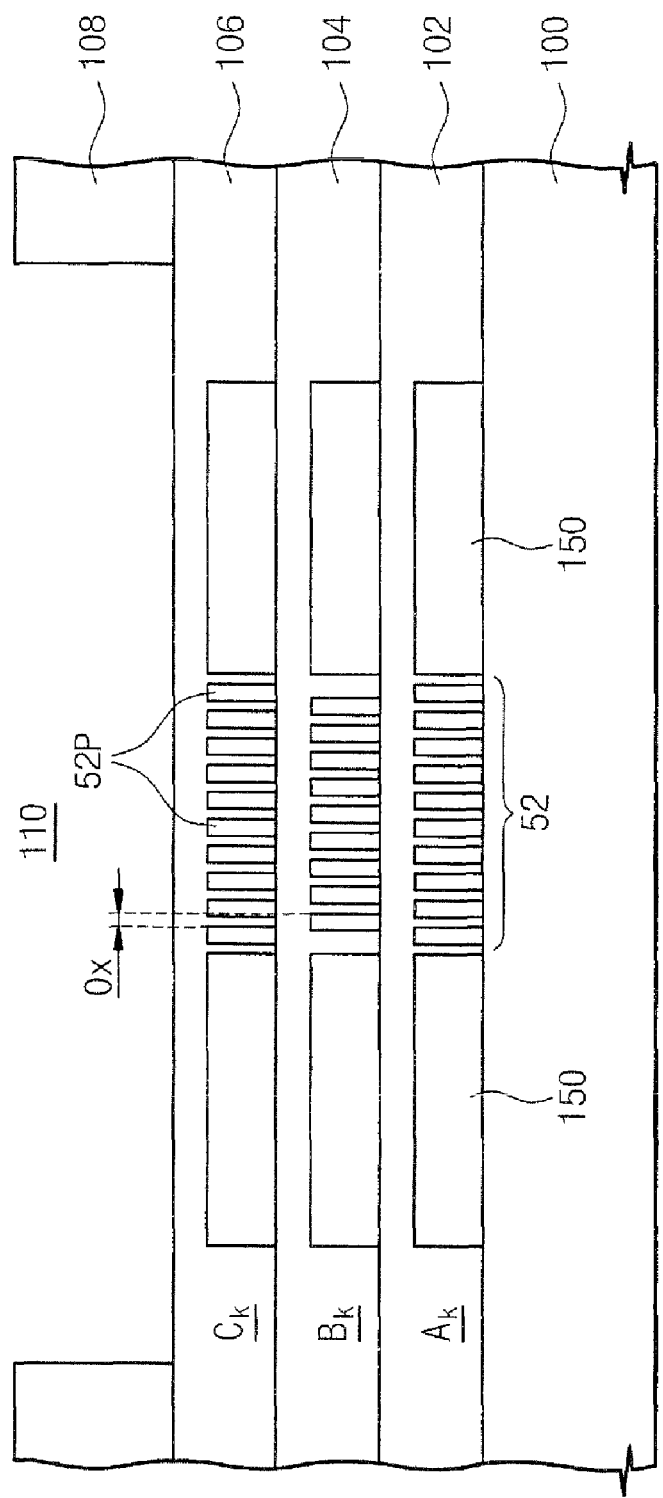

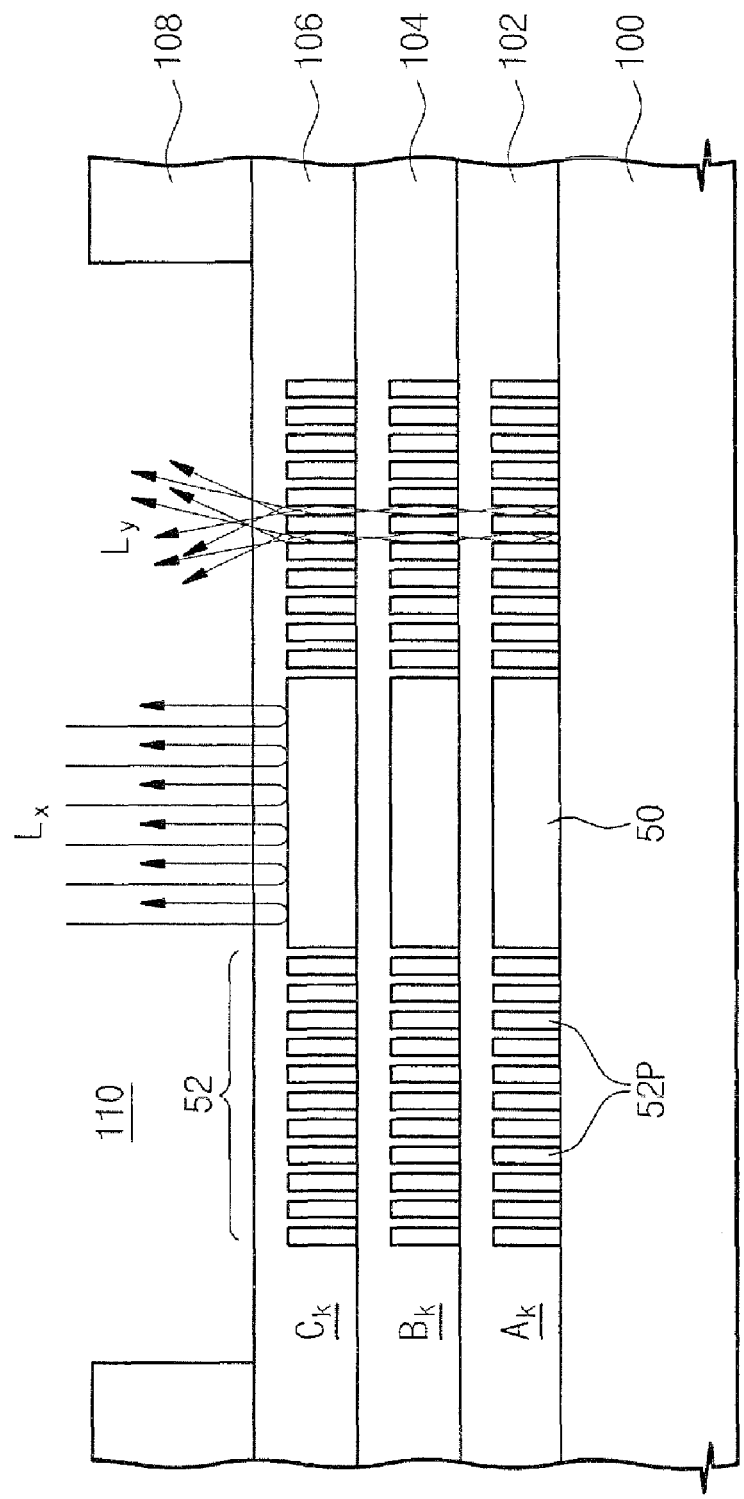

ALIGNMENT MARK

CROSS-REFERENCE TO RELATED APPLICATIONS

This patent application claims the benefit of foreign priority under 35 U.S.C. §119 to Korean Patent Application No. 2006-108511 filed on Nov. 3, 2006, the entirety of which is hereby incorporated by reference.

BACKGROUND

1. Field of Invention

Embodiments exemplarily described herein relate generally to alignment marks used in fabricating semiconductor devices or in assembling display devices. More particularly, embodiments exemplarily described herein relate to an optically recognizable alignment mark.

2. Description of the Related Art

The fabrication of semiconductor devices and the fabrication or assembling of display devices generally involves disposing layers, patterns, display units, and a drive integrated circuit (IC) within a permitted error limit. An alignment mark is used to dispose two or more objects in desired positions. Accordingly, the alignment mark is optically recognized to appropriately select the position of the alignment mark.

FIGS. 1 and 2 are plan views of a conventional alignment mark.

Referring to FIG. 1, the position of an object may be precisely indicated by coordinates along x- and y-axes of a rectangular coordinate system. Thus, the alignment mark 5 has interfaces parallel to an x-axis and a y-axis of a rectangular coordinate system so that x and y coordinates of the alignment mark 5 can be recognized. As illustrated in FIG. 1, the alignment mark 5 includes a cross-shaped main pattern 12 provided in a peripheral region 10. The main pattern 12 has a planar upper surface so that parallel light which is perpendicularly incident to the upper surface can be specularly reflected. The main pattern 12 also has interfaces parallel to the x-axis and the y-axis of the rectangular coordinate system. The position of the interfaces of the main pattern 12 can be recognized using signals of light reflected by the main pattern 12 and the peripheral region 10.

Referring to FIG. 2, because the main pattern 12 has interfaces parallel to an x-axis and a y-axis of a rectangular coordinate system, in which the x-axis is substantially perpendicular to the y-axis, x and y coordinates of the alignment mark 5 can be recognized. The accuracy with which the position of the alignment mark 5 can be recognized depends on the contrast between reflection light (i.e., light that is specularly reflected by the upper surface of the main pattern 12) and scattered light (e.g., light that is reflected by the peripheral region 10). An error in recognizing the interfaces of the main pattern 12 may be increased due to a low contrast between reflection light and scattered light. Accordingly, an alignment error of the object can be increased due to an error in recognizing the interfaces of the main pattern 12.

Although parallel light incident to the main pattern 12 is specularly reflected by the upper surface of the main pattern 12, parallel light incident to the interfaces of the main pattern 12 adjacent to the peripheral region 10 is irregularly reflected. As a result, a contrast between light reflected by the main pattern 12 and light reflected by the peripheral region 10 may be unclear.

Also, a plurality of insulating layers are typically formed on the alignment mark 5. As a result, the brightness of transmission light (i.e., light incident to the main pattern 12 and the peripheral region 10) and reflection light (i.e., light reflected by the main pattern 12 and the peripheral region 10) is degraded because the transmission light and reflection light must pass through the plurality of insulating layers. Thus, the contrast between specularly reflected light and scattered light is lowered. This phenomenon may worsen when a material layer having a non-uniform thickness is formed on the alignment mark 5.

As a result, a measurement time may be excessively delayed to obtain the quantity of light required for discerning the alignment mark 5, and the accuracy of the recognition of the alignment mark 5 can be degraded.

SUMMARY

Embodiments exemplarily described herein can be adapted to provide an alignment mark that is structured to increase the contrast of light reflected by the alignment mark. Embodiments exemplarily described herein can also be adapted to provide an alignment mark in which an interface between patterns can be clearly discerned.

One embodiment exemplarily described herein can be generally characterized as an alignment mark that includes a first pattern and a second pattern. The first pattern may have a substantially planar upper surface for specularly reflecting light. The second pattern may be adjacent to the first pattern and include fine patterns for irregularly reflecting light.

BRIEF DESCRIPTION OF THE DRAWINGS

FIGS. 6 through 9 are cross-sectional views of exemplary embodiments of the alignment marks shown in FIGS. 3 through 5; and FIG. 10 is a diagram for explaining an alignment mark according to an exemplary embodiment of the present invention.

DETAILED DESCRIPTION

Figure 1:
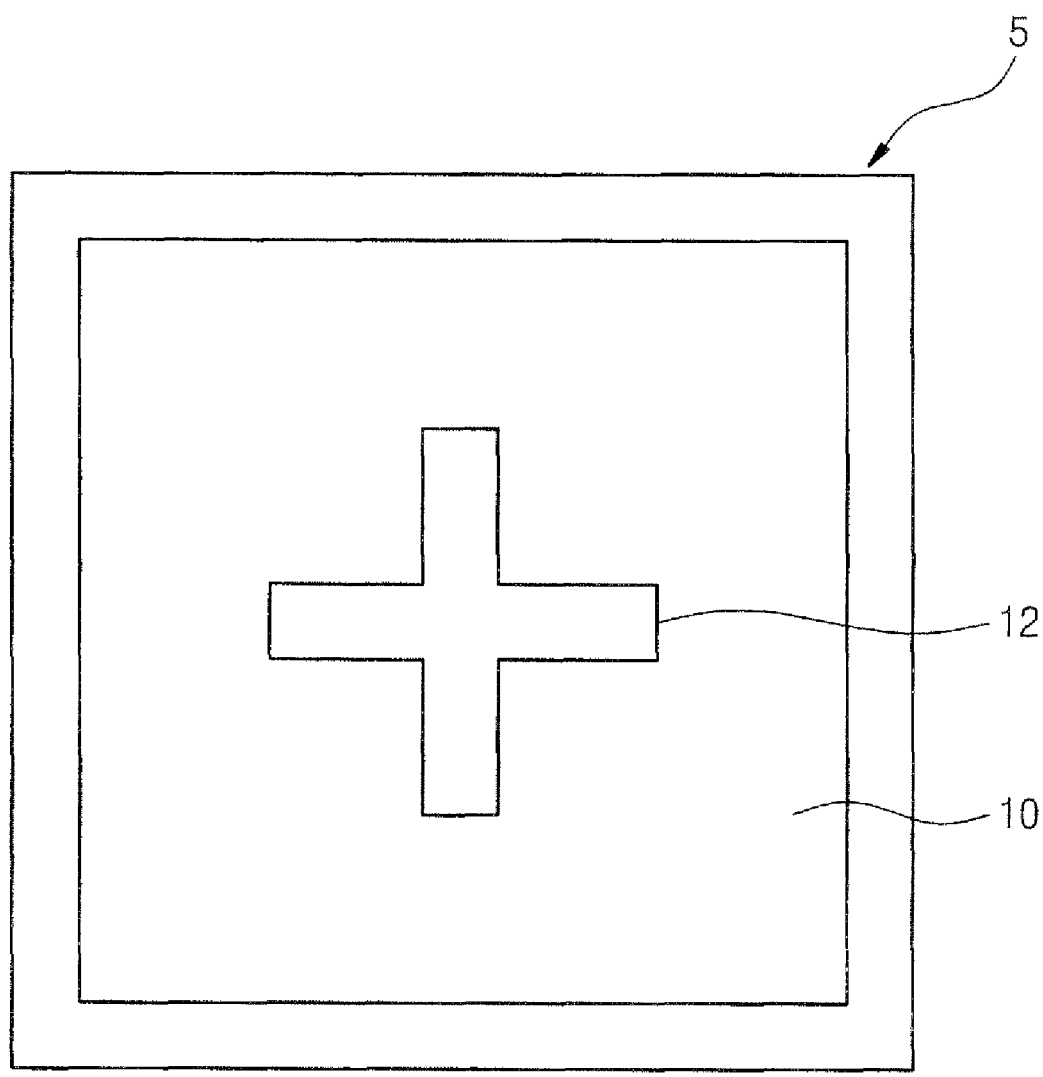
FIGS. 1 and 2 are diagrams for explaining a conventional alignment mark.
Figure 2:
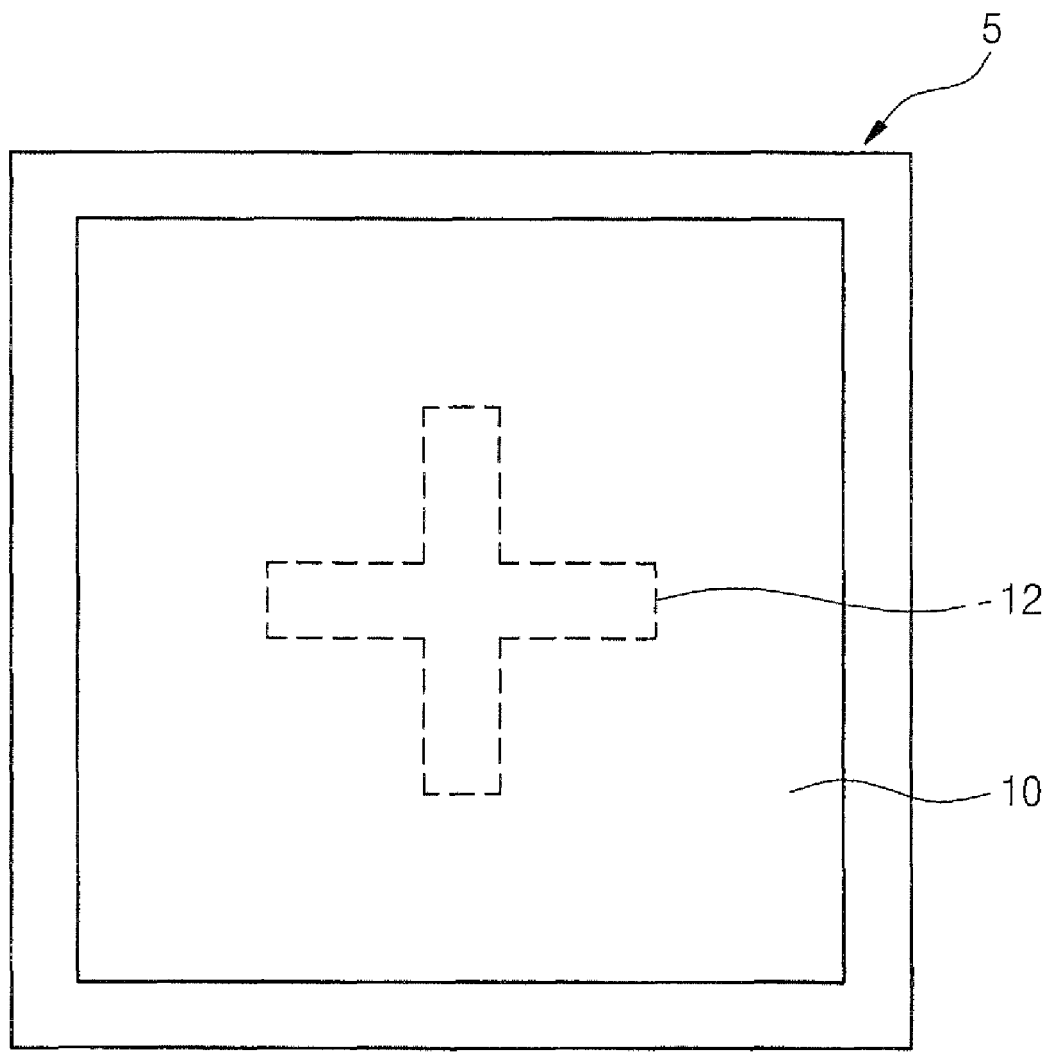

Exemplary embodiments of the present invention will now be described more fully hereinafter with reference to the accompanying drawings. These embodiments may, however, be realized in many different forms and should not be construed as limited to the embodiments set forth herein. Rather, these embodiments are provided so that this disclosure will be thorough and complete, and will fully convey the scope of the invention to those skilled in the art. In the drawings, the thicknesses of layers and regions are exaggerated for clarity. It will also be understood that when a layer is referred to as being "on" another layer or substrate, it can be directly on the other layer or substrate, or intervening layers may also be present. Like numbers refer to like elements throughout.

Figure 3:
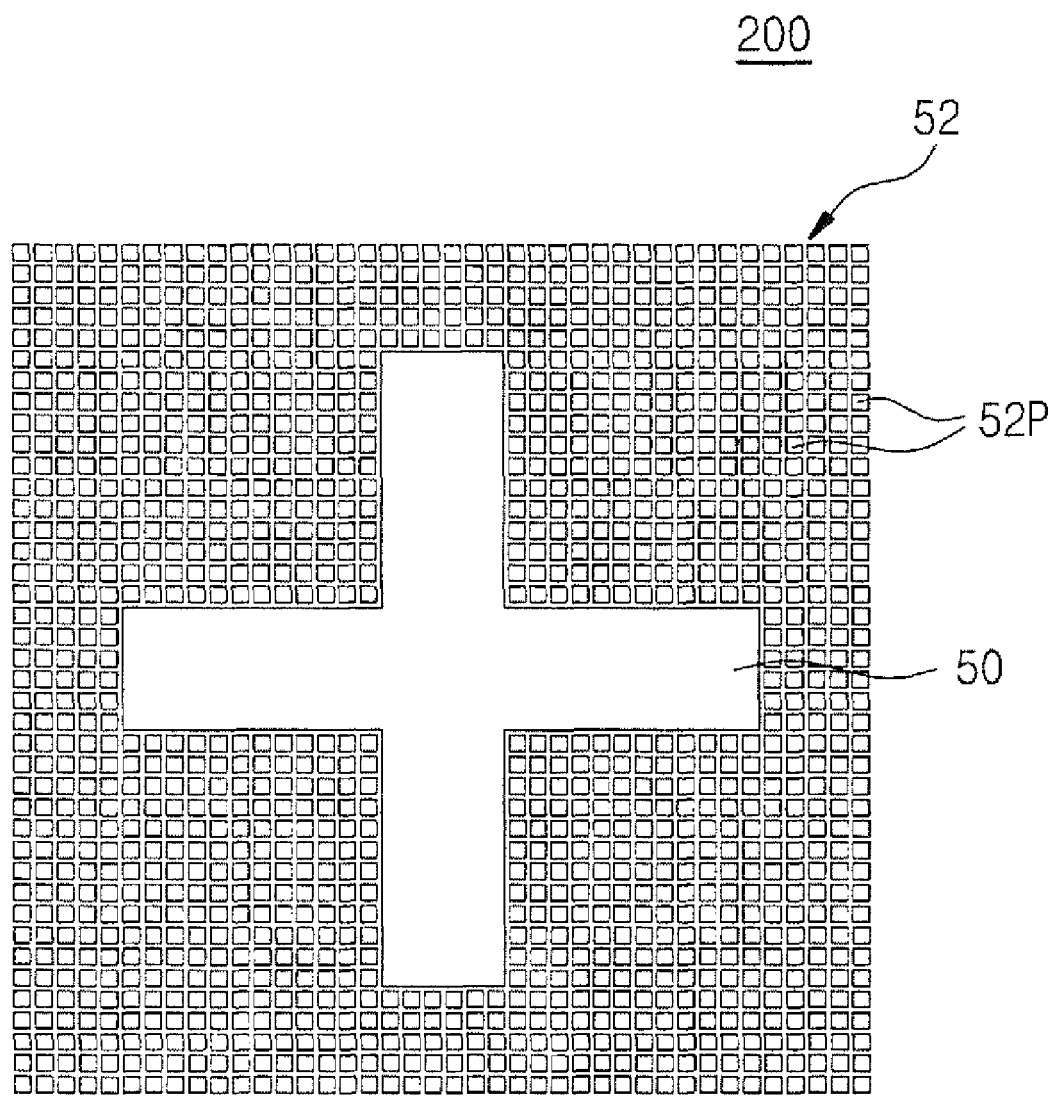
FIGS. 3 through 5 are plan views of exemplary embodiments of alignment marks.
Figure 4:
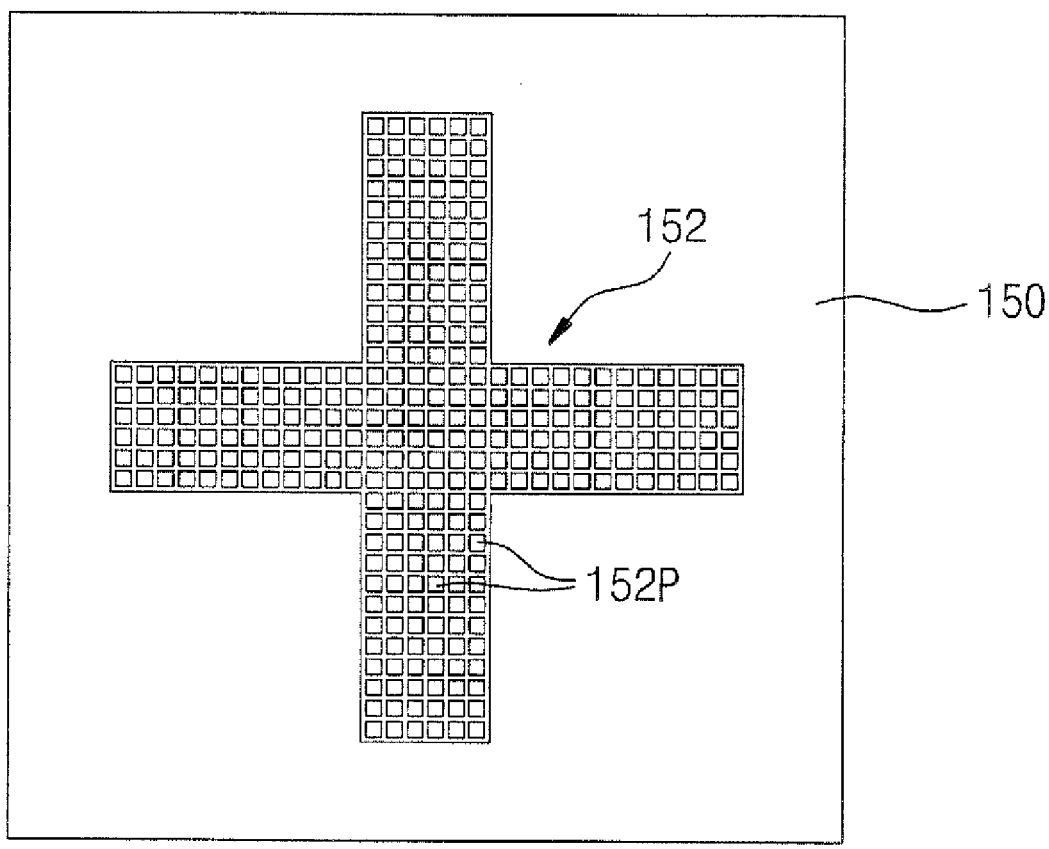
Figure 5:
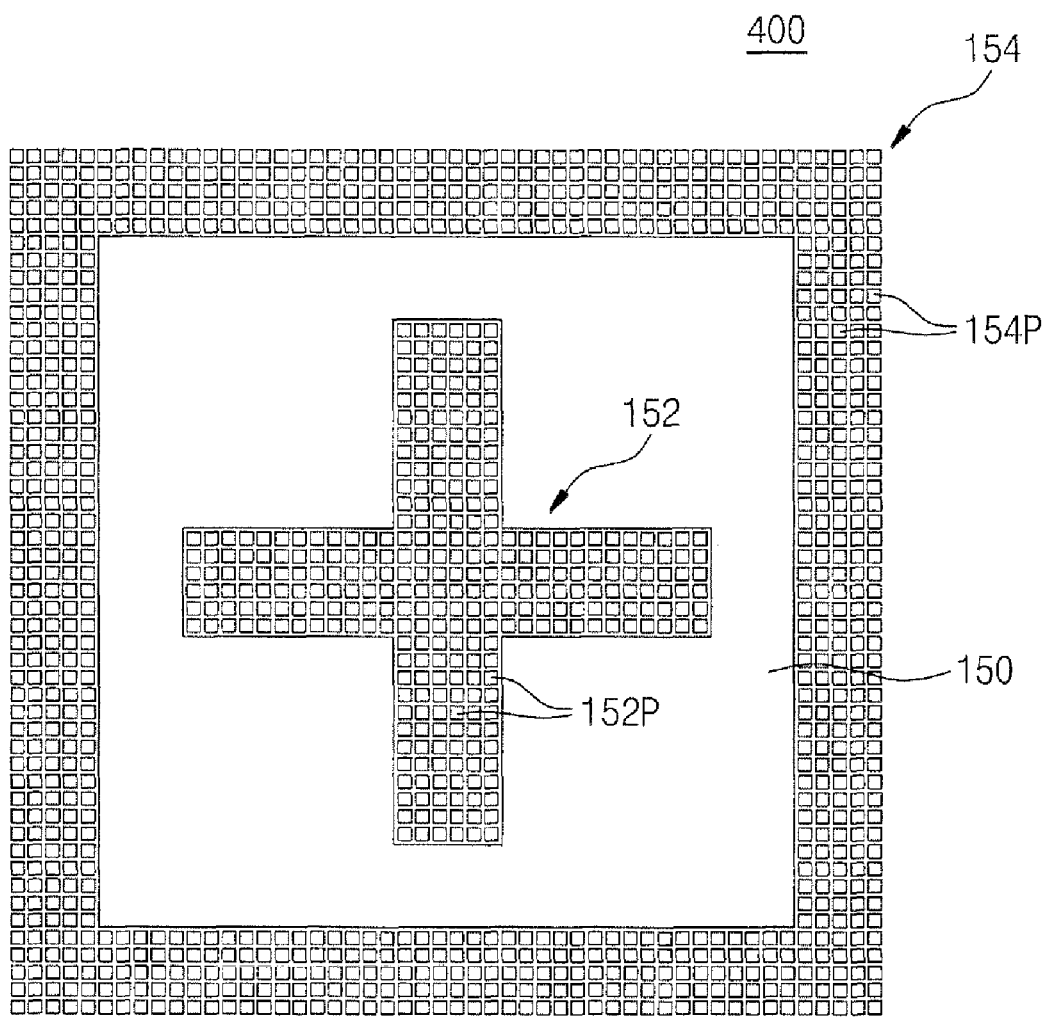

FIGS. 3 through 5 are plan views of exemplary embodiments of alignment marks.

Referring to FIG. 3, an alignment mark 200 according to one embodiment may, for example, include a first pattern 50 and a second pattern 52. In one embodiment, the first pattern 50 has a substantially planar upper surface so that light (e.g., parallel light) which is substantially perpendicularly incident to the first pattern 50 can be specularly reflected. In another embodiment, the first pattern 50 includes interfaces that are substantially parallel to x- and y-axial directions of a rectangular coordinate system. In one embodiment, the interfaces of the first pattern 50 may be substantially perpendicular to the upper surface of the first pattern 50. The second pattern 52 includes a plurality of fine patterns 52*p* disposed along x- and y-axial directions of a rectangular coordinate system. In one embodiment, the plurality of fine patterns 52*p* may be disposed along the x- and y-axial directions of the rectangular coordinate system at a predetermined pitch. In another embodiment, each of the plurality of fine patterns 52*p* may have substantially the same shape. Because the second pattern 52 includes the fine patterns 52*p*, light (e.g., parallel light) that is substantially perpendicularly incident to the second pattern 52 can be irregularly reflected. The second pattern 52 is formed in a peripheral region of the first pattern 50. Accordingly, the fine patterns 52*p* substantially enclose the first pattern 50.

According to the embodiment illustrated in FIG. 3, reflection light is scattered at an interface between the first pattern 50 and the second pattern 52. Accordingly, a contrast between light reflected by the first pattern 50 and light reflected by the second pattern 52 can be enhanced. An alignment is recognized by using a variation of a signal detected at an interface of the first pattern 50. Thus, the first pattern 50 substantially functions as an alignment key that is strongly contrasted with the peripheral region. As a result, the position of the alignment key can be clearly recognized within a short amount of time.

X- and y-coordinates of a rectangular coordinates system can be precisely recognized using the alignment mark 200. For this, x- and y-axes, about which a signal varies, are required. Therefore, the first pattern 50 may have interfaces that are substantially parallel to the x- and y-axes and the fine patterns 52 may be formed adjacent to the interfaces of the first pattern 50.

In one embodiment, a distance between the first pattern 50 and one of the fine patterns 52*p* disposed closest to the first pattern 50 may be substantially equal to a distance between adjacent ones of the fine patterns 52*p* so that a signal variation can be detected at the interfaces of the first pattern 50.

Referring to FIG. 4, an alignment mark 300 according to another embodiment may, for example, be characterized as an inverted version of the alignment mark 200 shown in FIG. 3. Accordingly, the alignment mark 300 may, for example, include a first pattern 150 and a second pattern 152, wherein the second pattern 152 includes fine patterns 152*p*. The first pattern 150 may have a substantially planar upper surface so that light (e.g., parallel light) which is substantially perpendicularly incident to the first pattern 150 can be specularly reflected. The second pattern 152 includes the plurality of fine patterns 152*p* so light which is substantially perpendicularly incident to the second pattern 152 can be irregularly reflected. The fine patterns 152*p* are disposed along x- and y-axial directions of a rectangular coordinate system at a predetermined pitch.

According to the embodiment shown in FIG. 4, however, the first pattern 150 encloses (or substantially encloses) a region where the second pattern 152 is formed. Thus, the fine patterns 152*p* of the second pattern 152 are disposed in a region enclosed (or substantially enclosed) by the first pattern 150. The first pattern 150 has interfaces substantially parallel to x- and y-axes and which define a region where the second pattern 152 is formed. Therefore, the fine patterns 152*p* may be disposed adjacent to the interfaces of the first pattern 150. For the same reason as described above with respect to the embodiment shown in FIG. 3, a distance between the first pattern 150 and one of the fine patterns 152*p* disposed closest to the first pattern 150 may be substantially equal to a distance between adjacent ones of the fine patterns 152*p*.

Referring to FIG. 5, an alignment mark 400 according to yet another embodiment may, for example, include the first pattern 150 and the second pattern 152, and may further include a third pattern 154. The third pattern 154 may enclose (or substantially enclose) the first pattern 150. In one embodiment, the third pattern 154 may include fine patterns 154*p*. In one embodiment, the fine patterns 154*p* of the third pattern 154 may be similar to the fine patterns 152*p* of the second pattern 152 described above with respect to FIGS. 3 and 4. The first pattern 150 is in marked contrast with the second and third patterns 152 and 154, thus the efficiency of the alignment may increase.

The fine patterns 154*p* of the third pattern 154 are disposed adjacent to outer interfaces of the first pattern 150. In one embodiment, a distance between the first pattern 150 and one of the fine patterns 154*p* disposed closest to the first pattern 150 may be substantially equal to a distance between adjacent ones of the fine patterns 154*p*.

Figure 6:
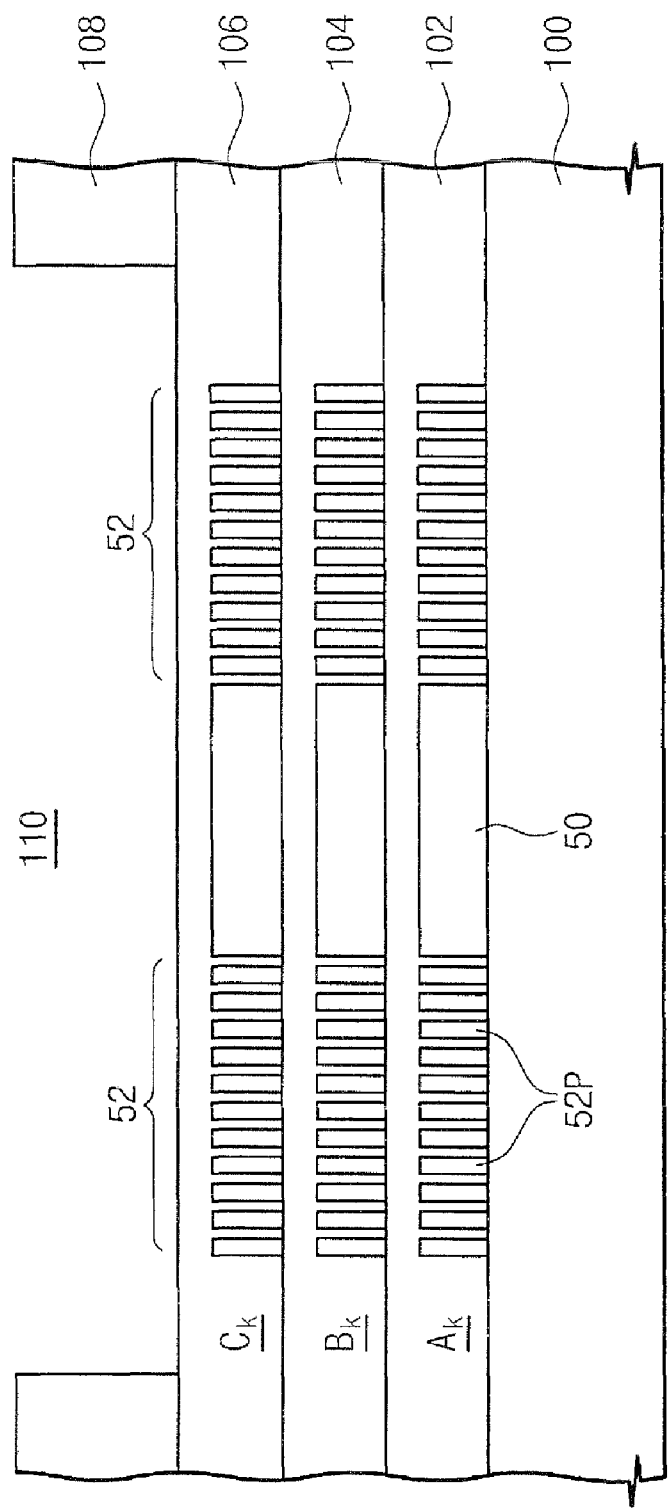

FIG. 6 is a cross-sectional view of one embodiment of the alignment mark shown in FIG. 3.

Referring to FIG. 6, the alignment mark shown in FIG. 3 may, for example, include a plurality of alignment layers Ak, Bk, and Ck. A first alignment layer Ak, a second alignment layer Bk, and a third alignment layer Ck may be sequentially stacked on a substrate 100 in a substantially vertical direction. Although FIG. 6 illustrates only three alignment layers Ak, Bk, and Ck, four or more alignment layers may be provided depending on, for example, the number of interconnection lines formed on the substrate 100.

Each of the alignment layers may include the first pattern 50, which has a substantially planar upper surface, and the second pattern 52, which is disposed in a peripheral region of the first pattern 50 and which includes the fine patterns 52*p*. In one embodiment, the first patterns 50 of the alignment layers may be substantially vertically aligned relative to one another. In one embodiment, the second patterns 52 of the alignment layers may be substantially vertically aligned relative to one another so that fine patterns 52*p* are substantially vertically aligned relative to one another. Because the fine patterns 52*p* are substantially vertically aligned relative to one another, the alignment mark shown in FIG. 6 may be integrally recognized as shown in FIG. 3, when viewed in plan view. However, the second pattern 52 reflects light more irregularly due to interference and diffraction of light incident and reflected between the fine patterns 52*p* of the alignment layers. As a result, a contrast between light reflected by the first pattern 50 and light reflected by the second pattern 52 of a multi-layer alignment mark can be enhanced as compared with a contrast between light reflected by the first pattern 50 and light reflected by the second pattern 52 of a single-layer alignment mark.

The first patterns 50 and the second patterns 52 may be spaced apart from one another by interlayer dielectric layers 102 and 104. The uppermost alignment layer Ck may be covered with a passivation layer 106. An upper surface of the passivation layer 106 may be substantially planar (i.e., planarized) over the first and second patterns 50 and 52 and may substantially fill gaps between adjacent ones of the fine patterns 52*p* of the uppermost alignment layer Ck.

A protection layer 108 may be formed on the passivation layer 106. An opening 110 may be formed within the protection layer 108 to expose the passivation layer 106 formed on the alignment mark. In one embodiment, the protection layer 108 may, for example, include an organic material such as a polyimide.

Figure 7:
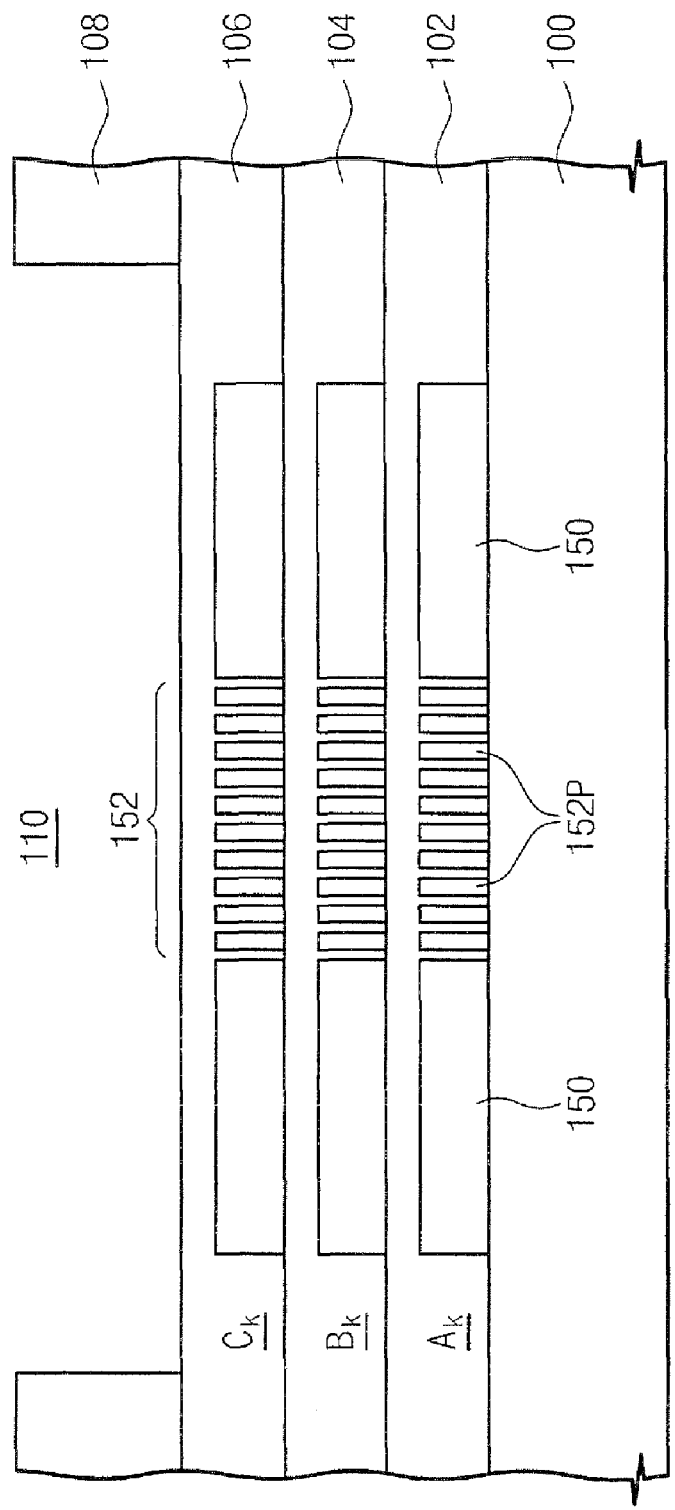

FIG. 7 is a cross-sectional view of one embodiment of the alignment mark shown in FIG. 4.

Referring to FIG. 7, the alignment mark shown in FIG. 4 may, for example, include a plurality of alignment layers Ak, Bk and Ck, similar to the alignment layers discussed above with respect to FIG. 6. Similar to the alignment mark shown in FIG. 6, first patterns 150 are substantially vertically aligned relative to one another and second patterns 152 are substantially vertically aligned relative to one another.

Although a cross-sectional view of the alignment mark shown in FIG. 5 is not explicitly shown, it will be appreciated that such an alignment mark may be substantially the same as the alignment mark shown in FIG. 7 but may further include third patterns 154 on opposing sides of the first patterns 150 within each alignment layer.

Figure 8:
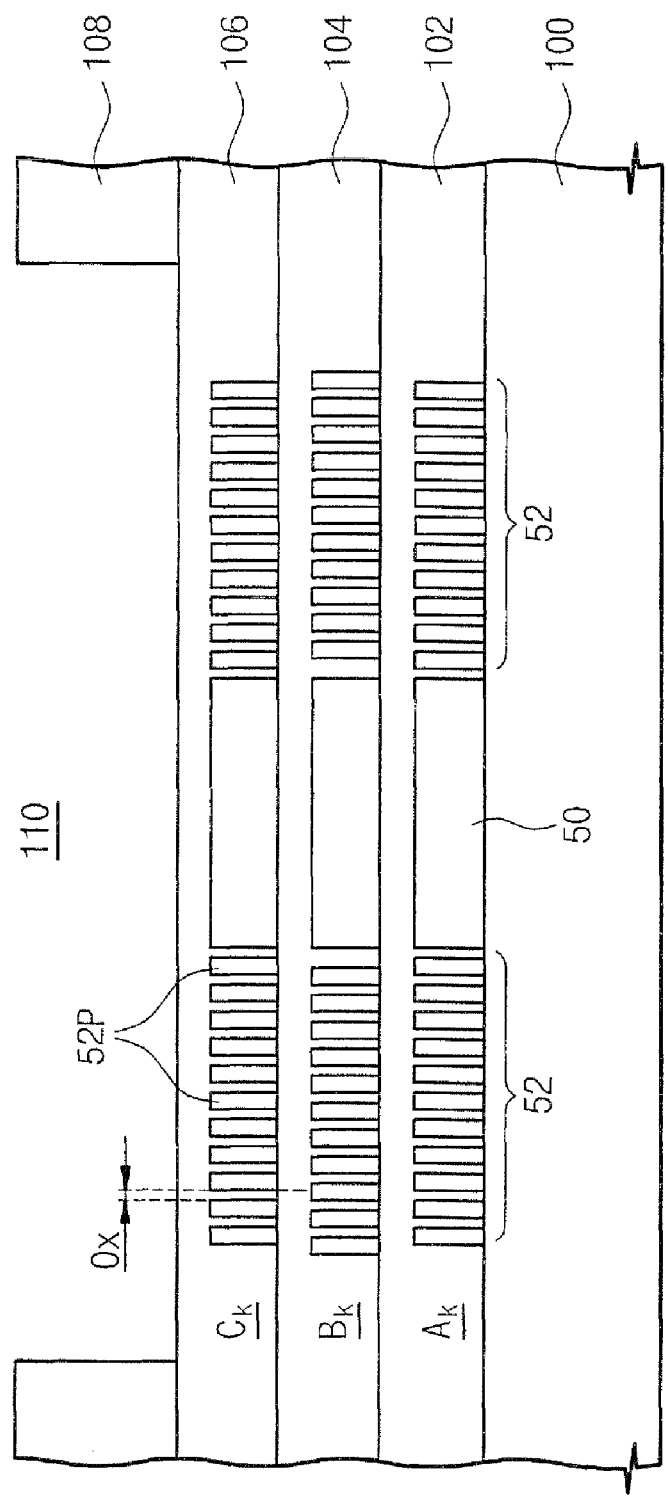

FIG. 8 is a cross-sectional view of another embodiment of the alignment mark shown in FIG. 3.

Referring to FIG. 8, the alignment mark shown in FIG. 3 may include a plurality of alignment layers Ak, Bk, and Ck. First patterns 50 of the alignment layers Ak, Bk, and Ck are substantially vertically aligned relative to one another. As shown in FIG. 8, however, the second patterns 52 of the alignment layers Ak, Bk, and Ck are not substantially vertically aligned relative to one another. As a result, the fine patterns 52p of the alignment layers Ak, Bk, and Ck are offset by a predetermined horizontal distance Ox relative to one another. For example, the fine patterns 52p of an upper alignment layer Ck are offset by the predetermined distance Ox from the fine patterns 52p of a lower alignment layer Bk. The fine patterns 52p may be offset in an x-axial direction, a y-axial direction, or both an x-axial direction and a y-axial direction. Because the fine patterns 52p of different alignment layers are offset relative to one another, the alignment mark shown in FIG. 6 is not integrally recognized as shown in FIG. 3, when viewed in plan view. Nevertheless, the second pattern 52 reflects light even more irregularly due to interference and diffraction of light incident and reflected between the fine patterns 52p of the alignment layers. As a result, a contrast between light reflected by the first pattern 50 and light reflected by the second pattern 52 of a multi-layer alignment mark can be further enhanced.

FIG. 9 is a cross-sectional view of another embodiment of the alignment mark shown in FIG. 4.

Referring to FIG. 9, in the alignment mark shown in FIG. 4, fine patterns 52p of an upper alignment layer may be offset from fine patterns 52p of a lower alignment layer in a similar manner as described above with respect to FIG. 8.

Although a cross-sectional view of the alignment mark shown in FIG. 5 is not explicitly shown, it will be appreciated that such an alignment mark may be substantially the same as the alignment mark shown in FIG. 9 but may further include third patterns 154 on opposing sides of the first patterns 150 within each alignment layer.

FIG. 10 is a diagram explaining an alignment mark according to an exemplary embodiment.

Referring to FIG. 10, parallel light Lx incident to a first pattern 50, which has a substantially planar upper surface, can be mostly reflected by the upper surface of the first pattern 50 and detected. Conversely, light incident to a second pattern 52 including fine patterns 52p is irregularly reflected at interfaces between the fine patterns 52p and reflected more irregularly due to the interference and diffraction of light incident and reflected between the fine patterns 52p.

Therefore, when scanning the alignment mark and to recognize a signal of reflection light, a contrast between light Lx reflected by the first pattern 50 and light Ly reflected by the second pattern 52 can be detected. As a result, the alignment mark can be recognized more effectively and a time required to recognize the alignment mark and an error in recognizing the alignment mark can be lessened.

According to some embodiments described herein, an alignment mark may include a first pattern and a second pattern. The alignment mark can be formed by patterning an interconnection metal layer. Accordingly, upper surfaces of the first and second patterns may include an interconnection metal layer, a barrier metal layer, or the like or a combination thereof.

According to some embodiments exemplarily described above, an alignment mark is formed to clearly discern an interface between a substantially planar pattern providing a specular reflection characteristic and fine patterns providing an irregular reflection characteristic. As a result, a contrast between the substantially planar pattern and the fine patterns can be enhanced.

According to some embodiments exemplarily described above, an alignment mark can be generally characterized as providing a specular reflection pattern and an irregular reflection pattern, in this order, along a direction proceeding from a central region of an alignment area of the substrate 100 to a peripheral region of the alignment area of the substrate 100 so that a contrast between the patterns can be increased more effectively. Also, an alignment mark can be generally characterized as providing an irregular reflection pattern and a specular reflection pattern, in this order, along a direction proceeding from the central region of the alignment area of the substrate 100 to the peripheral region of the alignment area of the substrate 100. Further, an alignment mark can be generally characterized as providing an irregular reflection pattern, a specular reflection pattern, and another irregular reflection pattern, in this order, along a direction proceeding from the central region of the alignment area of the substrate 100 to the peripheral region of the alignment area of the substrate 100. It will also be appreciated, however, that an alignment mark according to yet another embodiment can be generally characterized as providing a specular reflection pattern, an irregular reflection pattern and another specular reflection pattern, in this order, along a direction proceeding from the central region of the alignment area of the substrate 100 to the peripheral region of the alignment area of the substrate 100.

Furthermore, an alignment mark may include a plurality of alignment layers so that a contrast between light reflected by a specular reflection pattern and light reflected by an irregular reflection pattern can be further enhanced.

Examples of non-limiting embodiments of the present invention will now be described in the paragraphs below.

In an exemplary embodiment, the alignment mark may include: a first pattern disposed on a substrate and having a planar surface by which parallel light is specularly reflected; and a second pattern forming an interface with the first pattern and having a plurality of fine patterns, the second pattern by which parallel light is irregularly reflected.

In an embodiment, the alignment mark may include a plurality of alignment layers aligned in a vertical direction. Each of the alignment layers may include the first pattern and the second pattern. The alignment mark may include a plurality of first patterns, which are stacked vertically, and a plurality of second patterns, which are stacked vertically.

In an embodiment, fine patterns of upper and lower alignment layers may be aligned in a vertical direction. In another embodiment of the present invention, fine patterns of upper and lower alignment layers may be offset at a predetermined interval.

The first pattern may be enclosed with the second pattern. Alternatively, the second pattern may be enclosed with the first pattern. The first pattern may have x-axial and y-axial interfaces of rectangular coordinates, and the fine patterns of the second pattern may be disposed adjacent to the x-axial and y-axial interfaces of the first pattern.

A planar passivation layer may be disposed over the first and second patterns. Gaps between fine patterns may be filled with passivation patterns.

Although embodiments have been exemplarily described as illustrated in the accompanying drawings, it is not limited thereto. It will be apparent to those skilled in the art that various substitutions, modifications and changes may be made without departing from the scope and spirit of the invention.

What is claimed is:

1. An alignment mark comprising:
   a first pattern disposed on a substrate, the first pattern having a substantially planar upper surface for specularly reflecting light;
   a second pattern adjacent to the first pattern, the second pattern including a plurality of fine patterns for irregularly reflecting light;
   wherein the first pattern substantially encloses the fine patterns of the second pattern;
   a third pattern enclosing the first pattern, wherein the third pattern includes a plurality of fine patterns; and
   a passivation layer covering the first and second patterns, wherein an upper surface of the passivation layer over the first and second patterns is substantially planar.

2. The alignment mark as recited in claim 1, wherein the alignment mark includes a plurality of alignment layers aligned in a substantially vertical direction and wherein each alignment layer includes the first pattern and the second pattern.

3. The alignment mark as recited in claim 2, wherein fine patterns of a first one of the plurality of alignment layers are substantially vertically aligned relative to fine patterns of a second one of the plurality of alignment layers adjacent to the first one of the plurality of alignment layers.

4. The alignment mark as recited in claim 2, wherein fine patterns of a first one of the plurality of alignment layers are horizontally offset by a predetermined distance relative to fine patterns of a second one of the plurality of alignment layers adjacent to the first one of the plurality of alignment layers.

5. The alignment mark as recited in claim 4, wherein the fine patterns are horizontally offset along x- and y-axial directions of a rectangular coordinate system.

6. The alignment mark as recited in claim 4, wherein the fine patterns are horizontally offset along an x- or a y-axial direction of a rectangular coordinate system.

7. The alignment mark as recited in claim 2,
   wherein the passivation layer substantially fills a gap between adjacent ones of the fine patterns of the uppermost one of the plurality of alignment layers.

8. The alignment mark as recited in claim 1, wherein the first pattern has interfaces substantially parallel to x-axial and y-axial directions of a rectangular coordinate system and the second pattern includes a plurality of fine patterns disposed adjacent to the interfaces of the first pattern.

9. The alignment mark as recited in claim 8, wherein a distance between the first pattern and one of the fine patterns disposed closest to the first pattern is substantially equal to a distance between the adjacent ones of the fine patterns.

10. The alignment mark as recited in claim 1, wherein the fine patterns of the second pattern substantially enclose the first pattern.

11. The alignment mark as recited in claim 10, further comprising a fourth pattern adjacent to the second pattern, the fourth pattern having a substantially planar upper surface for specularly reflecting light.

12. The alignment mark as recited in claim 1, further comprising a protection layer disposed on the passivation layer, wherein the protection layer includes an opening defined therein exposing a portion of the passivation layer covering the first and second patterns.

13. The alignment mark as recited in claim 12, wherein the protection layer includes an organic material.

14. The alignment mark as recited in claim 1, wherein the fine patterns are disposed at a predetermined pitch along x- and y-axial directions of a rectangular coordinate system.

* * * * *